(12) United States Patent
Loopstra et al.

(10) Patent No.: US 9,164,401 B2
(45) Date of Patent: Oct. 20, 2015

(54) PROJECTION SYSTEM AND LITHOGRAPHIC APPARATUS

(75) Inventors: Erik Roelof Loopstra, Eindhoven (NL); Wilhelmus Petrus De Boeij, Veldhoven (NL); Hans Butler, Best (NL); Robertus Johannes Marinus De Jongh, Eindhoven (NL); Jan Bernard Plechelmus Van Schoot, Eindhoven (NL); Timotheus Franciscus Sengers, 's-Hertogenbosch (NL); Maurice Willem Jozef Etiënne Wijckmans, Eindhoven (NL); Franciscus Johannes Joseph Janssen, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 540 days.

(21) Appl. No.: 13/061,792

(22) PCT Filed: Jul. 17, 2009

(86) PCT No.: PCT/EP2009/059222
§ 371 (c)(1),
(2), (4) Date: Mar. 2, 2011

(87) PCT Pub. No.: WO2010/037575
PCT Pub. Date: Apr. 8, 2010

(65) Prior Publication Data
US 2011/0170078 A1    Jul. 14, 2011

Related U.S. Application Data

(60) Provisional application No. 61/101,291, filed on Sep. 30, 2008, provisional application No. 61/121,873, filed on Dec. 11, 2008.

(51) Int. Cl.
*G03F 7/20* (2006.01)

(52) U.S. Cl.
CPC ........ *G03F 7/70891* (2013.01); *G03F 7/70258* (2013.01); *G03F 7/70825* (2013.01)

(58) Field of Classification Search
CPC ............ G03F 7/70825; G03F 7/70258; G03F 7/70266; G03F 7/706; G03F 7/709; G03F 7/20; G03F 7/70141; G03F 7/70833; G03F 7/70275; G03F 7/70233; G03F 7/70316; G03F 7/70883; G03F 9/7096
USPC .................... 355/30, 53, 63, 67, 77
See application file for complete search history.

(56) References Cited

U.S. PATENT DOCUMENTS

| | | | |
|---|---|---|---|
| 6,630,984 | B2 | 10/2003 | Bisschops |
| 7,061,579 | B2 | 6/2006 | Bartray et al. |

(Continued)

FOREIGN PATENT DOCUMENTS

| | | | |
|---|---|---|---|
| EP | 1 178 357 A1 | 2/2002 | |
| EP | 1 457 834 A2 | 9/2004 | |

(Continued)

OTHER PUBLICATIONS

International Search Report directed to related International Patent Application No. PCT/EP2009/059222, the International Searching Authority, European Patent Office, Rijswijk, Netherlands, mailed Sep. 30, 2009; 5 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

A projection system (PS) is provided which includes, in an embodiment, two frames. The optical elements of the projection system are mounted on a first frame (200). The position of the optical elements is measured relative to a second frame (300) using a first measurement system (910). A second measurement system (920) is used to measure a parameter associated with a deformation of the second frame. The measurement made by the second measurement system can be used to compensate for any errors in the position of the optical elements as measured by the first measurement system resulting from deformations of the second frame. Typically, deformations of the frames are due to resonant oscillation and thermal expansion. Having two frames enables the optical elements of the projection system to be positioned with a high degree of accuracy. Optionally, a temperature control system (780, 790) may be provided to drive the temperature of at least one of the frames back to a desired value after the lithographic apparatus has been taken off line.

23 Claims, 3 Drawing Sheets

(56) References Cited

U.S. PATENT DOCUMENTS

| | | |
|---|---|---|
| 7,218,382 B2 | 5/2007 | Kasumi |
| 7,221,460 B2 | 5/2007 | Ohtsuka |
| 7,236,230 B2 | 6/2007 | Miyajima |
| 2004/0179192 A1 | 9/2004 | Mizuno et al. |
| 2005/0063288 A1 | 3/2005 | Nawata et al. |
| 2005/0140950 A1* | 6/2005 | Franken et al. ............... 355/53 |
| 2008/0037029 A1 | 2/2008 | Nawata |
| 2009/0056914 A1* | 3/2009 | Ruijl et al. ............... 165/104.19 |

FOREIGN PATENT DOCUMENTS

| | | |
|---|---|---|
| JP | 2003-007586 A | 1/2003 |
| JP | 2004-266264 A | 9/2004 |
| JP | 2004-327529 A | 11/2004 |
| JP | 2005-150732 A | 6/2005 |
| TW | 200527502 A | 8/2005 |
| TW | 200528930 A | 9/2005 |

OTHER PUBLICATIONS

International Preliminary Report on Patentability and Written Opinion of the International Searching Authority directed to related International Patent Application No. PCT/EP2009/059222, the International Bureau of WIPO, Geneva, Switzerland and the International Searching Authority, European Patent Office, Munich, Germany, mailed Apr. 5, 2011; 7 pages.

* cited by examiner

PROJECTION SYSTEM AND LITHOGRAPHIC APPARATUS

BACKGROUND

1. Field

Embodiments of the present invention relate to a projection system, a lithographic apparatus, a method of positioning an optical element and a method of projecting a beam of radiation onto a target.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, a beam of radiation may be patterned by a patterning device which is then projected onto the substrate by a projection system. In this way, the pattern may be transferred to a substrate. The accuracy with which the patterned beam of radiation may be projected onto the substrate by the projection system can affect the overall accuracy and performance of the lithographic apparatus. Any deviation in the position of the patterned beam due to, for example, inaccuracies in the projection system may result in errors of the pattern formed by the substrate. Such errors may be, for example, overlay errors, in which one part of a pattern is not correctly positioned relative to another part of a pattern. Other errors can include focus errors and contrast errors.

In order to minimize errors introduced by the projection system, it is necessary to ensure that the optical elements within the projection system (that are used to direct and/or condition the patterned beam of radiation) are accurately positioned. It has previously been known to provide a frame to which each of the optical elements is mounted, and to adjust the position of each of the optical elements relative to the frame in order to position the optical elements. In order to provide accurate positioning of the optical elements, the frame onto which the optical elements are mounted and positioned relative to must be both mechanically stiff and have high thermal stability (i.e. it must not substantially deform under thermal loading).

In order to improve the performance of the lithographic apparatus (for example, by providing smaller feature sizes), the numerical aperture of the lithographic apparatus can be increased. However, increasing the numerical aperture means that larger optical elements are required in the projection system. This, in turn, means that the frame on which the optical elements are mounted must increase in size. Increasing the size of this frame means that it is increasingly difficult to produce a structure that is both stiff enough and thermally stable enough for the accurate performance that is required. Thus, it is increasingly difficult, and in some cases not possible, to position the optical elements of a projection system with sufficient accuracy as the numerical aperture of that projection system increases.

BRIEF SUMMARY

The inventors have discovered a projection system, for example, for use in a lithographic apparatus, having improved performance. In particular, a projection system is provided in which the optical elements can be positioned with greater accuracy.

According to an aspect of the invention there is provided a projection system for a lithographic apparatus including a first frame, a second frame, an optical element mounted to the first frame, a first measurement system configured to determine the position of the optical element relative to the second frame, and a second measurement system configured to measure at least one parameter dependent on a deformation of the second frame.

According to another aspect of the invention there is provided a lithographic apparatus including a support constructed to support a patterning device that is capable of imparting a radiation beam with a pattern in its cross-section to form a patterned radiation beam, a substrate table constructed to hold a substrate, and a projection system as disclosed above, configured to project the patterned radiation beam onto a target portion of the substrate.

According to another aspect of the invention there is provided a method of positioning an optical element in a projection system including determining the position of the optical element that is mounted to a first frame relative to a second frame, and measuring at least one parameter dependent on a deformation of the second frame.

According to another aspect of the invention there is provided a method of projecting a beam of radiation onto a substrate, including providing a beam of radiation using a radiation source, and directing the beam of radiation using at least one optical element using the method disclosed above.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

DETAILED DESCRIPTION

Figure 1:
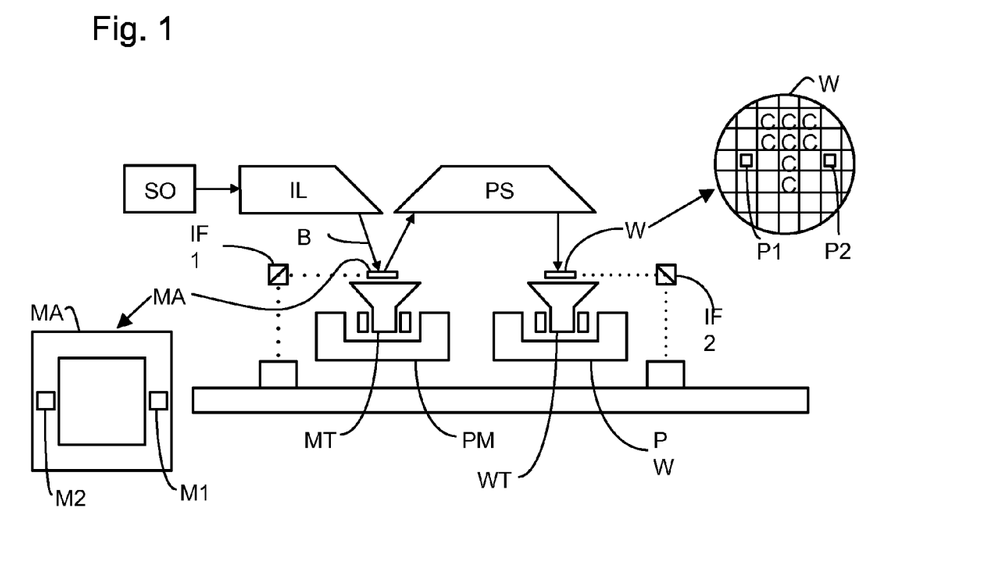
FIG. 1 depicts a lithographic apparatus according to an embodiment of the invention.

FIG. 1 schematically depicts a lithographic apparatus according to one embodiment of the invention. The apparatus includes:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to radiation beam B by patterning device MA onto a target portion C (e.g. including one or more dies) of substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system BD including, for example, suitable directing mirrors and/or a beam expander. In other cases the source may be an integral part of the lithographic apparatus, for example when the source is a mercury lamp. Source SO and illuminator IL, together with the beam delivery system BD if required, may be referred to as a radiation system.

Illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator IN and a condenser CO. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of the second positioner PW and position sensor IF2 (e.g. an interferometric device, linear encoder or capacitive sensor), substrate table WT can be moved accurately, e.g. so as to position different target portions C in the path of radiation beam B. Similarly, first positioner PM and another position sensor IF1 can be used to accurately position mask MA with respect to the path of radiation beam B, e.g. after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of target portion C imaged in a single static exposure.

2. In scan mode, mask table MT and substrate table WT are scanned synchronously while a pattern imparted to the radiation beam is projected onto a target portion C (i.e. a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as required after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 6:
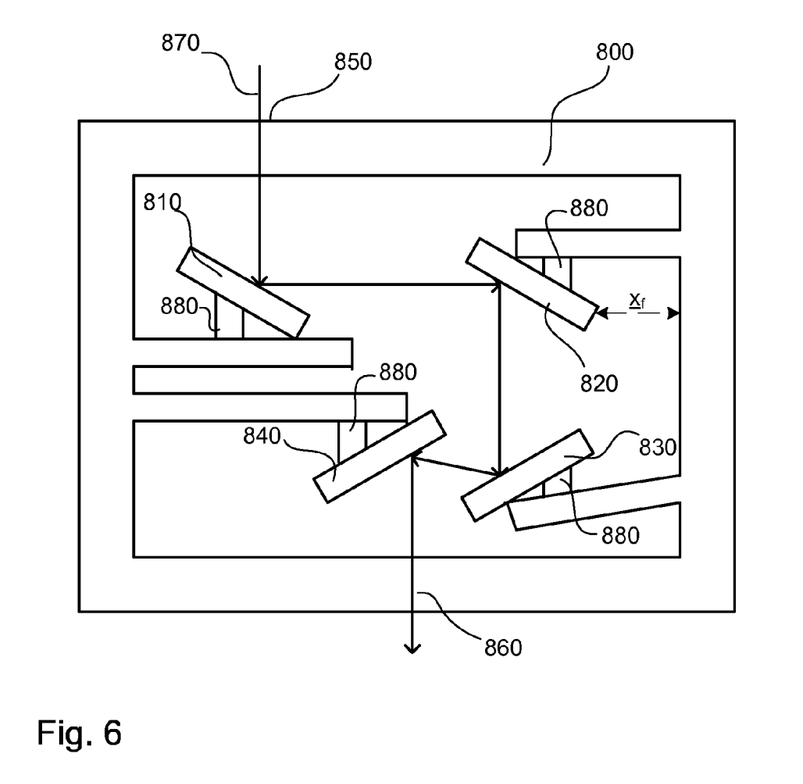
FIG. 6 depicts a typical arrangement of a known projection system.

A typical arrangement of a known projection system PS is shown in FIG. 6. As shown in this figure, a radiation beam 870 enters the projection system through a transmissive portion 850 in a support frame 800. The radiation beam may have imparted thereon a pattern in its cross-section, for example from a patterning device. The radiation beam 870 is then typically directed and/or conditioned by optical elements 810, 820, 830 and 840 before leaving the projection system by a transmissive portion 860 in the support frame 800. As described above, in order to ensure that the position of the patterned beam (for example relative to a substrate W being exposed) is controlled accurately, it is necessary to control accurately the position of optical elements 810, 820, 830 and 840 in the projection system.

In the typical system shown in FIG. 6, the position of optical elements 810, 820, 830 and 840 is controlled relative to support frame 800 of the projection system. Thus, considering for example second optical element 820, the position is typically controlled using a measurement system that measures the position of optical element 820 relative to support frame 800. In FIG. 6, this measurement is shown as the arrow labeled $X_f$. In order for the absolute position of optical elements 810, 820, 830 and 840 (for example with respect to the reference point with a constant position) to be controlled using this known system of FIG. 6, support frame 800 itself must have a constant position relative to that reference point. As such, any motion and/or distortion of support frame 800 itself will result in a corresponding movement (in absolute terms) of optical elements 810, 820, 830 and 840, because optical elements 810, 820, 830 and 840 are measured relative to support frame 800. Thus, in order to control accurately the position of radiation beam 870 exiting the projection system shown in FIG. 6, the support frame 800 of the projection system must be dimensionally and geometrically stable during operation.

Typically, a support frame 800 in the known projection system PS shown in FIG. 6 would need to be both thermally stable and mechanically stable. In other words, support frame 800 would need to be resistant to changes in shape due to thermal loads (for example by being constructed from a material with a low coefficient of thermal expansion) and also resistant to changes in shape due to mechanical (for example vibrational) loads (for example having a lowest eigen frequency that is above the lowest typical excitation frequency that frame 800 would experience during operation). In addition to acting as a reference frame for measuring the position of optical elements 810, 820, 830, 840, conventional frame 800 also supports actuators 880 that may be used to alter the position of optical elements 810, 820, 830, 840. Thus, frame 800 experiences reaction forces from actuators 880. This means that frame 800 must be both mechanically stiff (for example with regard to vibrational loads), and able to support and react against actuators 880.

As explained herein, as the numerical aperture of the lithographic apparatus in which projection system PS is used is increased, the size of the optical elements required in projection system PS increases. This results in a corresponding increase in the size of the frame of the projection system in which the optical elements are mounted. Thus, because having a high numerical aperture is advantageous in lithographic apparatus (for example because it allows smaller feature sizes to be exposed on a substrate W) the size of the frames of the projection system are becoming larger. However, as the size of the frames of projection systems are increased, the demands set out above of the frame requiring both thermal and mechanical stability are more difficult to achieve. In particular, a projection system PS including a frame 800 such as that shown in FIG. 6 may not be made both thermally and mechanically stable enough to provide sufficiently accurate positioning (in absolute terms) of optical elements 810, 820, 830 and 840 of the projection system using current materials and/or construction techniques.

Figure 2:
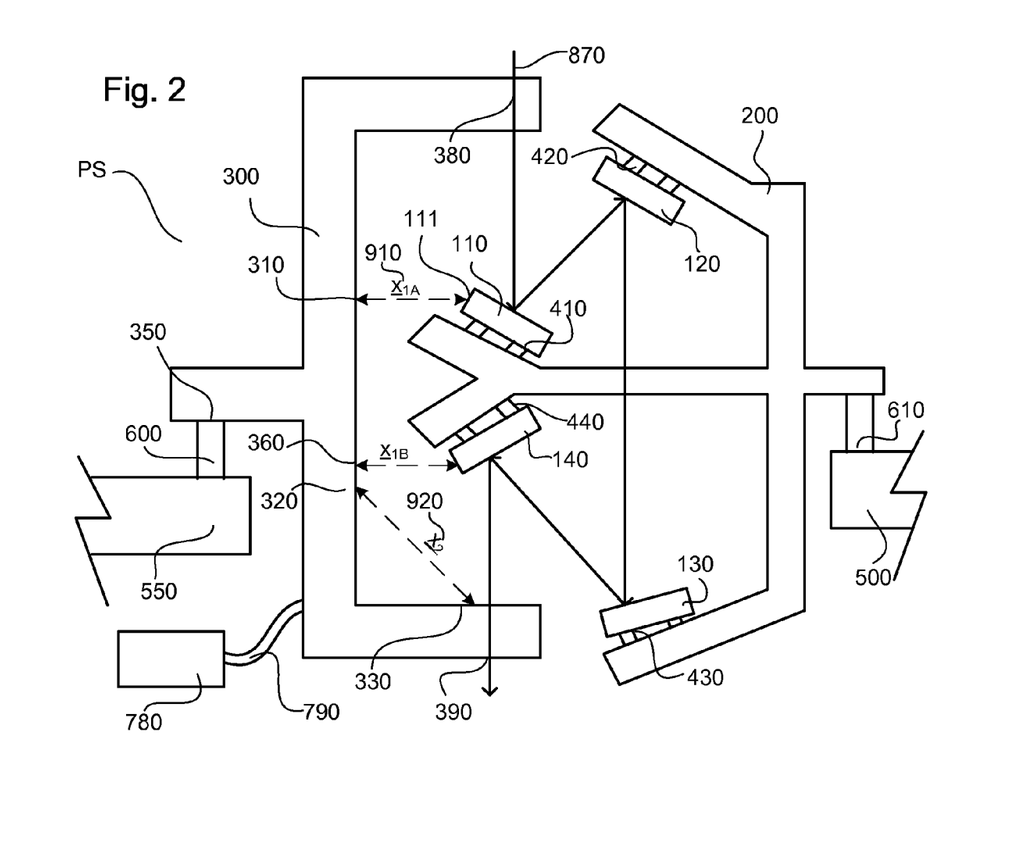
FIG. 2 depicts an arrangement of a projection system according to an embodiment of the present invention.

A projection system according to an embodiment of the present invention is shown in FIG. 2. The projection system shown in FIG. 2 includes a first frame 200 (which may also be referred to herein as a force frame 200), and a second frame 300 (which may also be referred to herein as a measurement frame 300). As shown in FIG. 2, a radiation beam 870 (which may be a patterned radiation beam) enters projection system PS via a transmissive portion 380. In FIG. 2, transmissive portion 380 is shown as being in measurement frame 300. In alternative embodiments, transmissive portion 380 could be formed in an alternative manner, for example in force frame 200. In other embodiments, a transmissive portion 380 may not be required at all. For example, in some embodiments, radiation beam 870 could pass into projection system PS through a gap in the structure.

Having entered projection system PS via transmissive portion 380, radiation beam 870 is directed and/or conditioned in projection system PS using optical elements 110, 120, 130, 140. Optical elements 110, 120, 130, 140 may be any suitable optical elements, for example transmissive or reflective optical elements. In the embodiments shown in FIG. 2, optical elements 110, 120, 130, 140 are reflective optical elements, such as mirrors. In the embodiment shown in FIG. 2, four optical elements 110, 120, 130, 140 are illustrated. However, in alternative embodiments any other suitable number of optical elements could be used in projection system PS. For example, one, two, three, four, five, six, seven, eight, nine or ten optical elements could be used. In other embodiments, more than ten optical elements could be used.

Once radiation beam 870 has been directed and/or conditioned by optical elements 110, 120, 130, 140 in projection system PS, radiation beam 870 exits projection system PS via a transmissive portion 390. Once again, in the illustrated embodiment, transmissive portion 390 is shown as being in measurement frame 300. In alternative embodiments, transmissive portion 390 could be formed in any other suitable part of projection system PS, for example, in force frame 200. In some embodiments, the radiation beam could exit projection system PS through a gap, rather than a transmissive portion 390.

As can be seen in FIG. 2, optical elements 110, 120, 130, 140 are mounted to force frame 200. As described in greater detail below, optical elements 110, 120, 130, 140 may be mounted to force frame 200 using one or more actuators 410, 420, 430, 440. Actuators 410, 420, 430, 440 may be used to adjust the position of optical elements 110, 120, 130, 140, for example under the instruction of a controller 700 (described later).

Figure 3:
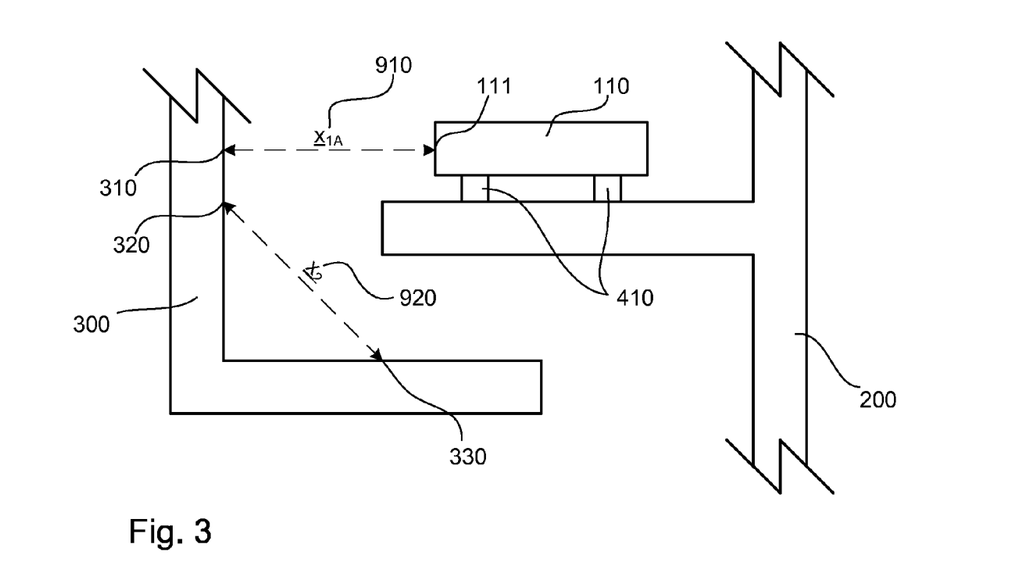
FIG. 3 depicts a single optical element in part of a projection system according to an embodiment of the present invention.
Figure 5:
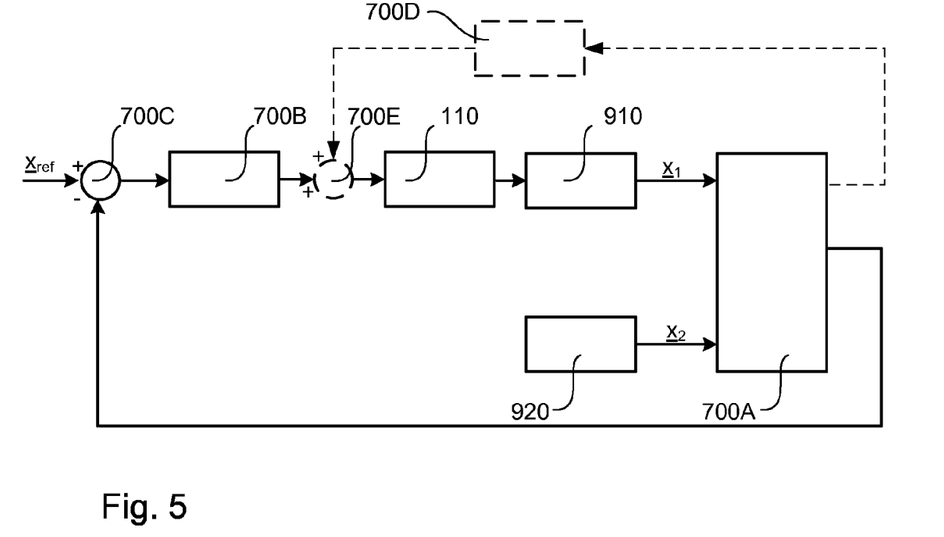
FIG. 5 depicts a control loop that may be used to control the position of an optical element according to an embodiment of the present invention.

According to an embodiment of the invention, the position of one or more of optical elements 110, 120, 130, 140 is measured relative to measurement frame 300 using a first measurement system 910 (see FIG. 3 and FIG. 5). First measurement system 910 may also be referred to herein as a frame measurement system 910.

A parameter that is dependent on, or related to, a deformation of measurement frame 300 (for example, due to thermal or mechanical, such as vibrational, loads) is then measured using a second measurement system 920. Second measurement system 920 may also be referred to herein as a mirror measurement system 920. By measuring the position of optical elements 110, 120, 130, 140 relative to measurement frame 300, and then measuring a parameter related to the deformation of that measurement frame 300, the position of one or more of optical elements 110, 120, 130, 140 of projection system PS relative to a (preferably constant) reference position can be determined, calculated and/or controlled with greater accuracy.

The operation of the first and second measurement systems is described in greater detail below.

As referred to herein, the term "position" (for example in relation to the position of an optical element either in relation to a reference point or in relation to one or both of measurement frame 300 and/or force frame 200) can mean the position in or orientation about any one or more axes in a three dimensional space. In other words, the term "position" as used herein can mean the position, or value, in any one or more of the axes in a six-axes system, i.e. the position in any one or more of three orthogonal axes and/or the rotation about any one or more of those three orthogonal axes.

By providing a projection system PS with first and second frames 200, 300, the control and/or measurement of the position of optical elements 110, 120, 130, 140 can be more stable under varying thermal and/or mechanical loads. Providing a projection system PS with first and second frames 200, 300 can also mean that the position of radiation beam 870 can be controlled with greater accuracy relative to substrate W and/or patterning device MA.

Improved control and/or measurement of the position of optical elements 110, 120, 130, 140 can be achieved by having one of the frames designed to be more stable under changes in thermal load (for example changes in temperature) than the other frame. The frame that is more stable under changes in thermal load may also be more stable under mechanical loads (for example more resistant to changes in shape due to vibrational loads). Thus, one of the frames may be more thermally stable and more mechanically stable than the other frame. The frame that is less thermally and/or mechanically stable may have optical elements 110, 120, 130, 140 mounted onto it via actuators 410, 420, 430, 440. In this way, the frame that is more thermally and/or mechanically stable would not be required to support actuators 410, 420, 430, 440 or provide reaction forces to them.

One measure of whether or not a frame is mechanically stable may be the value of its lowest eigen frequency. It will be understood that, as used herein, the term eigen frequency can mean resonance frequency. Thus, in this context a frame that is considered to be sufficiently mechanically stable would typically have a lowest eigen frequency that is, for example, greater than 100 Hertz, more typically the lowest eigen frequency would be, for example, greater than 200 Hertz and more typically, the lowest eigen frequency would be, for example greater than 300 Hertz.

If one frame is more stable than another frame under certain loads, it can mean that the more stable frame is more resistant to changes in shape, dimensions and/or geometry under that load, be it thermal, mechanical, or any other load. Typically, measurement frame 300 would be more mechanically stable than force frame 200. Also typically, measurement frame 300 would also be more thermally stable than force frame 200. Thus, measurement frame 300 would typically be both more thermally and mechanically stable than force frame 200. Force frame 200 would be used to mount and support optical elements 110, 120, 130, 140 via actuators 410, 420, 430, 440.

In alternative embodiments, force frame 200 may be constructed to be more thermally stable than measurement frame 300. Additionally or alternatively, force frame 200 may be constructed to be more mechanically stable than measurement frame 300.

In order to make one of the frames more stable to a particular type of load than the other frame, the frames may be constructed using different materials. For example, in order to make one frame more thermally stable than the other frame, a material with a lower co-efficient of thermal expansion may be chosen. Similarly, one of the frames may be made to be more mechanically stable than the other frame by selecting a suitable material with a higher stiffness. For example, one of the frames may be constructed using a material that produces a structure with a lowest eigen frequency that is higher than if the frame were constructed using the material of the other frame. Thus, measurement frame 300 may be constructed from a material (or materials) with higher stiffness and lower co-efficient of thermal expansion than the material (or materials) from which force frame 200 is constructed.

The construction and/or geometry of frames 200, 300 may also be adjusted so as to achieve the desired thermal and/or mechanical stability of each frame, as required.

As stated above, in order to improve the control and/or measurement of the position of the optical element 110, 120, 130 and 140, one of the frames (typically the measurement frame 300) is designed to be more stable to changes in thermal load than the other frame. Additionally or alternatively, this frame (typically the measurement frame) may be designed to be shielded from thermal loads. Typically, its greater stability to any changes in thermal load may result from the measurement frame 300 (in the case that this is the frame which is more thermally stable) having a high thermal time constant. If the frame has a higher thermal time constant, then the temperature of that frame remains more stable as the temperature of the surrounding environment fluctuates. In particular, the thermal time constant characterizes the response time (to first order) of the frame to a temperature change in the environment. The thermal time constant may represent the time it takes for the (measurement) frame to reach a given percentage (e.g. 63%) of the difference between its initial temperature and its final temperature after a change in the environmental temperature. The thermal time constant may be defined as: $mc_p/(hA)$ (with m, $c_p$, h and A being defined as in Equations 1 and 2 below).

In order to achieve a high thermal time constant, the heat transfer coefficient (h) of the heat transfer to and/or from the measurement frame 300 may be made to be low (i.e. for a given temperature difference between the frame and the surrounding environment, the heat transfer rate to/from the frame may be made low). This can be seen from Equation 1 below:

$$\Delta Q/\Delta t = hA\Delta T_{env} \quad \text{(Equation 1)}$$

where:
$\Delta Q/\Delta t$=heat transfer rate to/from frame, W
h=heat transfer coefficient to frame, W/(m²K)
A=heat transfer surface area of frame, m²
$\Delta T_{env}$=temperature difference between frame surface and surrounding environment, K Alternatively or additionally, a high thermal time constant may be achieved by choosing a high specific heat capacity ($c_p$) for the frame in question. Additionally or alternatively, an increase in mass (m) can lead to a higher thermal time constant. Thus, as can be seen from Equation 2 below, an increase in the value of $mc_p$ can mean that for a given amount of heat transferred to the frame, the temperature rise of the frame is low:

$$Q=mc_p\Delta T_{frame} \quad \text{(Equation 2)}$$

where:
Q=heat transfer to frame, J
m=mass of frame, Kg
$c_p$=specific heat capacity of frame, J/(KgK)
$\Delta T_{frame}$=temperature change of frame Having a high thermal time constant may help to ensure accuracy during exposure. For example, if the temperature of the frame remains more stable, then the deformation of the frame due to changes in temperature is small, and thus the measurement of the position of the optical element 110, 120, 130, 140 may be highly accurate.

However, when the projection system including the force frame 200 and the measurement frame 300 is taken off-line (for example for cleaning and/or repair), the temperature of the force frame 200 and/or the measurement frame 300 may drift away from the optimum value at which it should be kept during exposure of substrates. Before exposure of the substrates can commence again when the apparatus comes back on-line (for example, after the cleaning and/or repair has finished), the temperature of the frames 200, 300 needs to be returned to the desired value.

If one of the frames is designed to have a high thermal time constant in order to be thermally stable, then that frame takes a significant period of time to return to the desired temperature if it is simply returned back into the controlled operating environment. For example, if, after being taken off-line, the temperature offset of the measurement frame 300 (assuming that this is the frame which has the higher thermal time constant) to the desired temperature is approximately 300 mK, then the time taken to return to the desired temperature could be at least 10 hours. This results in increased down-time of the lithographic apparatus, with a corresponding reduction in yield of exposed substrates.

In order to reduce the time taken for the measurement frame 300 to return to its desired operating temperature, a temperature control system may be provided. The temperature control system may be configured to drive the temperature of the measurement frame 300 back towards its operating temperature after it has drifted away from the operating temperature, for example, due to a period of down-time. As such, the temperature control system may be configured to lower the thermal time constant of the frame in question when in use, namely when the temperature control system is being used to return the frame to an operating temperature. As may be understood from the explanation above in relation to Equations 1 and 2, this may be achieved by either: (i) increasing the heat transfer coefficient (h) of the heat transfer to the frame; and/or (ii) reducing the specific heat capacity ($c_p$) and/or the mass (m) of the frame, such that the value of ($mc_p$) decreases.

Alternatively or additionally, the time taken for the measurement frame 300 to return to its desired operating temperature may be reduced by appropriate control of the temperature of the environment surrounding the frame 300. For example, if the measurement frame 300 has drifted to a temperature that is too low, then a heater may be provided to increase the temperature of the surrounding environment. If the measurement frame has drifted to a temperature that is too high, then a cooler, or refrigeration unit may be provided to decrease the temperature of the surrounding environment. A controller may be used in such an embodiment to control the temperature of the surrounding environment as required.

In one embodiment, shown in FIG. 2, the temperature control system comprises a fluid supply unit 780, 790 that is used to supply a fluid to the measurement frame 300. Heat is transferred to and/or from the fluid in the fluid supply system 780, 790 by the frame 300, thereby altering the temperature of the frame 300. By supplying fluid to the measurement frame 300, the heat transfer to/from the measurement frame 300 may be significantly increased. The fluid supplied to the measurement frame 300 may be through internal and/or external ducts, for example.

According to this embodiment, a control system 780 may be provided as part of the temperature control system 780, 790. The control system 780 may be configured so as to only allow the temperature control system to be turned on (e.g. activated or operated) when the lithography apparatus of which the measurement frame 300 is a part is not being used to expose a substrate. This could mean that the flow rate of the fluid is set to zero when the lithographic apparatus is being used to expose a substrate. Not operating the temperature control system 780, 790 when the apparatus is being used to expose a substrate means that, during exposure, the thermal time constant of the measurement frame 300 remains (relatively) large, and thus the frame remains thermally stable. Additionally, because no fluid is flowing in or around the measurement frame 300 during exposure, there are no associated dynamic effects on the frame 300, such as unwanted vibrations.

Using such a temperature control system 780, 790 may reduce the time taken to return the frame 300 to the desired operated temperature by a factor up to 2, 5, 7, or 10 or more.

For example, the time to return to the desired operating temperature may be reduced from 7 hours to 1 hour.

In this embodiment, a fluid control system 780 may be used to control the operation of the temperature control system 780, 790 during operation to increase the heat transfer rate to/from the measurement frame 300. For example, the fluid control system 780 could be used to control a parameter of the fluid flow, for example the temperature and/or the flow rate of the fluid (which could be water) and optionally the time period over which the temperature control system 780, 790 is active. The fluid control system 780 may comprise a temperature measurement sensor. A temperature measurement sensor may be provided on the frame whose temperature is being controlled and/or in the fluid flow, for example at the point where it leaves the frame. The measured temperature value(s) may then be compared to desired temperature value(s). Based on the difference between the measured and desired temperature value(s), a controller (which may be part of the fluid control system 780) may be used to determine the required heating and/or cooling of the fluid. The calculation and/or determination of the required heating or cooling may comprise a proportional and/or proportional/integral algorithm.

The fluid control system 780 may also comprise a heater or heating element in contact with the fluid of the temperature control system 780, 790. The heating element may provide a heat input to the fluid. The amount of heat input to the fluid by the heating element may be controlled based on the output from the controller in order to drive the temperature of the frame to the desired value. Alternatively or additionally, the fluid control system 780 may comprise a cooling element, such as a peltier element, which may be in contact with the fluid. The amount of heat removed from the fluid by the cooling element may be controlled based on the output of the controller in order to drive the temperature of the frame to the desired value.

The temperature control system 780, 790 may be configured to drive the temperature of the measurement frame 300 to a target temperature. This target temperature may be the desired temperature of the measurement frame 300 during exposure of a substrate. This desired temperature may, for example, be a known temperature at which measurements relating to the position of the optical elements 110, 120, 130, 140 can be most accurately made. The target temperature may also be the temperature of the measurement frame 300 before it was taken off-line.

In an alternative embodiment, the temperature control system could operate by increasing the pressure of the gas (for example nitrogen or hydrogen or air) surrounding the measurement frame 300, rather than by providing a separate fluid supply system. Increasing the pressure of the gases surrounding the measurement frame 300 may increase the heat transfer to and/or from the measurement frame 300. For example, the heat transfer may be increased by a factor of up to 2, 5, 7, or 10 or more. This may be provided by increasing the heat transfer coefficient of the heat transfer to/from the frame. Typically, the heat transfer would increase by a factor of approximately 5 if the pressure of the gas around the measurement frame 300 were increased from 3.5 Pa to 150 Pa.

In the description above, and in FIG. 2, the temperature control system 780, 790 is shown as being provided to the measurement frame 300. However, in alternative embodiments, the temperature control system 780, 790 could additionally or alternatively be provided to the force frame 200. Thus, the time taken to return the temperature of the force frame 200 and/or the measurement frame 300 to the operating level could be reduced.

The same temperature control systems 780, 790 may be used to control the temperature of the force frame 200 and the measurement frame 300 (for example in order to return the temperature of both frames to the operating level). Using the same temperature control system 780, 790 may allow the temperature difference between the force frame 200 and the measurement frame 300 to be as small as possible. Once the temperature of the two frames 200, 300 has returned to the desired operating level, it may be possible to continue to control the temperature of the force frame 200 using the temperature control system 780, 790 even during exposure of substrates.

It will be understood that a suitable temperature control system 780, 790 (such as, for example, one of those described above) could be applied to any projection system and/or lithographic apparatus described and/or claused herein. For example, the temperature control system 780, 790 may be applied to a lithographic apparatus using Extreme Ultraviolet radiation (an "EUV" lithographic apparatus). Alternatively, some embodiments of the invention may not include such a temperature control system 780, 790 at all.

The first and second measurement systems will now be described in greater detail with reference to FIGS. 2 and 3.

The explanation of the first measurement system will be made with specific reference to first optical element 110 shown in the embodiment of FIG. 2, and shown in greater detail in FIG. 3. As can be seen in FIGS. 2 and 3, the position of optical element 110 may be measured relative to a point 310 on measurement frame 300 using first measurement system 910. As explained above, measurement of the position of optical element 110 can mean measurement of the spatial position (in three orthogonal axes) and/or rotational position (in any one or more of three orthogonal rotational axes). Thus, the first measurement system may take readings from one or more positions 111 on optical element 110 relative to position 310 on measurement frame 300.

As can been seen in FIG. 3, the position of optical element 110 relative to measurement frame 300 is given as $X_{1A}$. The first measurement system may include a contactless position measurement system. For example, such a contactless position measurement system may include an encoder and/or an interferometer.

Also illustrated in FIGS. 2 and 3 is a measurement $X_2$ made by second measurement system 920. As explained above, the second measurement system may be configured to measure at least one parameter dependent on a deformation of measurement frame 300. The deformation of measurement frame 300 may be due to, for example, thermal loads and/or mechanical loads. Thus, the second measurement system may be configured to measure a parameter related to the mechanical drift and/or distortion of the measurement frame. This mechanical drift or distortion may be, for example, due to thermal expansion due to temperature change of measurement frame 300. Additionally and/or alternatively, the mechanical drift and/or distortion of measurement frame 300 may be due to vibration of measurement frame 300.

In the embodiment shown in FIGS. 2 and 3, the measurement made by second measurement system 920 is the position of a second point 320 on measurement frame 300 relative to a third point 330 on measurement frame 300. Although not illustrated, second measurement system 920 may also measure the position of second point 320 on measurement frame 300 relative to a different point other than third point 330 on measurement frame 300. Additionally, the position of two points other than second point 320 and third point 330 on measurement frame 300 may be measured by second measurement system 920.

In some embodiments, the measurement of the at least one parameter dependent on the deformation of measurement frame 300 may be used by a controller 700 (described in more detail below) to determine and/or calculate the actual deformation of measurement frame 300. This calculated deformation may be at specific points of interest, or for the frame as a whole. For example, the measurement of at least one parameter (such as $X_2$) may be used to determine a vibrational mode shape of measurement frame 300.

In the embodiments shown in FIGS. 2 and 3, the measurement made by a second measurement system 920 is the relative position of one point 320 on measurement frame 300 relative to another point 330 on measurement frame 300. However, in alternative embodiments, different measurements related to the deformation of measurement frame 300 may be made by second measurement system 920. Examples of such alternatives can be seen in FIG. 4. The second measurement system may use a contactless position measurement system to measure the position of one point relative to another point. For example, the contactless measurement system may include an encoder and/or an interferometer.

Figure 4:
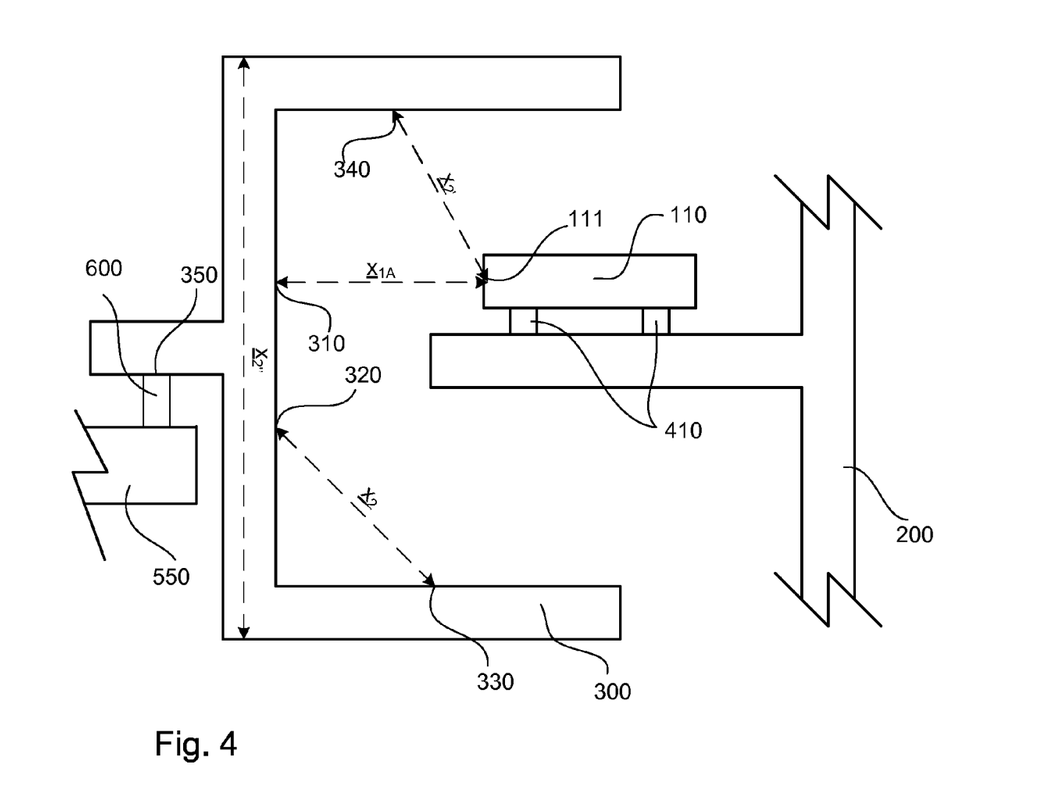
FIG. 4 depicts a measurement frame and part of a force frame for use in an arrangement of a projection system according to an embodiment of the present invention.

In FIG. 4, one alternative measurement made by second measurement system 920 is shown as measurement $X_{2'}$. This $X_{2'}$ measurement is between optical element 110 and a fourth position 340 on measurement frame 300. Because the position of optical element 110 relative to first position 310 on measurement frame 300 is known from first measurement system 910, measurement $X_{2'}$ from second measurement system 920 can be related to the deformation of measurement frame 300. Furthermore, measurement $X_{2'}$ from second measurement system 920 may be used in conjunction with measurement $X_{1A}$ from the first measurement system in order to determine what the deformation of measurement frame 300 actually is. This may be determined, for example, for measurement frame 300 as a whole, or for specific points (such as first point 310 used in first measurement system 910) of measurement frame 300. The calculation/prediction of the deformation of measurement frame 300 may be performed, for example, using controller 700 described in detail below.

A further example of a measurement that may be made by second measurement system 920 is shown as $X_{2''}$ in FIG. 4. This alternative (or additional) measurement made by second measurement system 920 relates to measurement of the strain of one or more parts of, or between one or more pairs of points on, measurement frame 300. As such, measurement $X_{2''}$ may be made, for example, using one or more strain gauges, or using one or more piezo-patches.

A combination of one or more of the possible measurements explained above (or indeed of any other suitable measurement) that could be made by second measurement system 920 may be incorporated into second measurement system 920. Furthermore, second measurement system 920 may include more than one of each of the possible measurements $X_2$, $X_{2'}$, $X_{2''}$ described above.

The measurements made by first measurement system 910 and second measurement system 920 may be used to determine, calculate and/or control the position of one or more of optical elements 110, 120, 130, 140 in projection system PS. This determination, calculation, and/or control may be of the position of optical elements 110, 120, 130, 140 relative to a reference point. Typically, the reference point may be a constant point that does not move relative to a target position of radiation beam 870. As described below, such a reference point may be a point 350 on measurement frame that is used to mount measurement frame to another frame, for example in a lithographic apparatus.

As shown in FIG. 5, a controller 700 may be used in an embodiment of the invention to perform various calculations an/or determinations, and/or to provide control signals based on, or using the measurements of, the first and second measurement systems.

As shown in the embodiment of FIG. 5, controller 700 may be split into at least two parts including: a first control part 700A taking input from first measurement system 910 and second measurement system 920; and a second control part 700B providing a control signal to control the position of one or more of optical elements 110, 120, 130, 140. In physical terms, the two parts of controller 700A and 700B may be contained in a single control unit 700. A summation processor 700C that can calculate the difference in the actual and desired positions of an optical element may also, optionally, be provided in a single control unit 700. Alternatively, the two control units 700A, 700B, and the summation unit 700C may be physically separate from each other.

Controller 700A may be used to determine and/or calculate the deformation of measurement frame 300 based on inputs from second measurement system 920. Controller 700A may also use inputs from first measurement system 910 in order to determine and/or calculate the deformation of measurement frame 300, as described above. Also as described above, the deformation of measurement frame 300 may be calculated using controller 700A at any desired position on measurement frame 300. The deformation of measurement frame 300 may also be calculated for the frame as a whole, for example by calculating a mode shape of a vibration mode.

As can be seen from FIG. 5, second measurement system 920 (which inputs the measurement $X_2$ to the controller 700A) may be separate from the control loop that is used to control the position of the optical element 110 in question. As such, the measurements made by second measurement system 920 may be filtered and/or averaged before being input into controller 700A. Alternatively, the inputs from second measurement system 920 may be filtered and/or averaged by controller 700A itself. This can have benefits when, for example, the deformations of measurement frame 300 are of a significantly lower frequency than the sampling rate used by second measurement system 920. This may be the case, for example, when second measurement system 920 is being used to measure primarily thermal deformations of measurement frame 300. Applying such filtering and/or averaging may help to increase the accuracy of the measurements from second measurement system 920 that are used by controller 700A.

In the embodiment shown in FIG. 5, once the first part of controller 700A has calculated the position of the optical element 110 in question using second measurement system 920 to compensate for motion of measurement frame 300 in the reading from first measurement system 910, this calculated position is compared with a reference position of optical element 110 using summation unit 700C. This comparison may be performed by a single controller 700.

Once the position of the optical element 110 in question has been compared with a desired reference position $X_{ref}$, a control signal may be produced by the second part of the controller, controller 700B. This control signal may be used to adjust the position of the optical element 110 in question. In this way, the position of the optical element 110 in question may be controlled relative to the reference point. Thus, an overall position of the optical element 110 in question may be controlled relative to, for example, a substrate W onto which radiation beam 870 is being projected.

Additional control elements 700D and 700E are shown in dotted lines in FIG. 5. These control elements are described in greater detail below. However, in some embodiments, control elements 700D, 700E shown in dotted lines in FIG. 5 are not present. In such embodiments not including elements 700D and 700E, the control signal produced by controller 700B may be used directly to control the position of optical element 110. As such, the output from controller 700B in FIG. 5 may be provided directly to optical element 110.

The determination, calculation, and/or control of the position of optical element(s) 110, 120, 130, 140 by controller 700 may be based on the measurements of first measurement system 910 and second measurement system 920. As such, the actual position of the optical element 110 in question need not be determined. Instead, the position of the optical element 110 in question may be determined and/or controlled relative to its last known position. In this way, controller 700 may be used to continually update the position of the optical element 110 in question, rather than recalculate its position (for example relative to a reference point) each time a measurement is taken.

The control signal output from controller 700B may be provided to one or more actuators 410 associated with the optical element 110 in question in order to control the position of the optical element 110 in question. In the examples shown in FIGS. 2 and 3, optical element 110 has two associated actuator units 410. These actuator units 410 are positioned between the optical element and the force frame. Actuator units 410 may be configured to provide a force between optical element 110 and force frame 200. In this way, the position of optical elements 110 may be adjusted in accordance with the control signal output from controller 700B. In other embodiments, the number of actuators 410 provided to each optical element 110 may be fewer than or greater than two. For example, the number of actuators 410 provided to an optical element 110 may be one, three, four, five or six. In alternative embodiments, there may be more than six actuators 410 provided to an optical element 110. Any suitable actuator may be used as an actuator 410 to provide a force between force frame 200 and an optical element 110. For example, a Lorentz actuator or a piezo actuator may be used.

The frequency with which second measurement system 920 takes measurements (for example of the position of optical element 110 relative to measurement frame 300) may be chosen according to the type of deformation of measurement frame 300 expected. For example, if the primary deformation of the measurement frame is due to thermal deformation, the frequency with which second measurement system 920 may be required to take measurements may be less than the frequency that may be required if the primary deformation of measurement frame 300 were a result of resonant oscillations. The expected type of deformation of force frame 200 may also be taken into consideration.

Similarly, the frequency with which first measurement system 910 is required to take measurements may be determined based on the expected type of deformation of force frame 200. The expected type of deformation of measurement frame 300 may also be taken into consideration. The frequency with which the first measurement system and the second measurement system take measurements may be the same as each other, or different from each other, as required.

In some embodiments a feedforward system may be employed to control the position of optical elements 110, 120, 130, 140. An example of such an embodiment is shown in FIG. 5 in which optional control elements 700D and 700E are also used.

In such an embodiment using a feedforward system, second measurement system 920 may be configured to measure a parameter related to the acceleration of at least one point on measurement frame 300. This may be in addition to the position measurements taken by second measurement system 920 described above. Such a measurement related to acceleration could be, for example, a direct acceleration measurement from an accelerometer. Alternatively or additionally, it may be possible to take velocity measurements or position measurements of at least one point on measurement frame 300, and use the velocity (or position) measurements to estimate or calculate the associated acceleration, for example using controller 700A. An interferometer may also be used to take measurements relating to acceleration of the measurement frame.

Deformation of measurement frame 300 may then be estimated from the acceleration. For example, if the accelerations of certain points on measurement frame 300 are known, then, provided that it is known where forces can be applied to the frame (e.g. at the mounting point), then the deformation of the frame may be calculated or predicted. In turn, this may be used in conjunction with the measurement of first measurement system 910 in the control of the position of optical elements 110, 120, 130, 140.

In the embodiment shown in FIG. 5 with feedforward included (e.g., with the elements shown in dotted lines included), a correction control unit 700D may be used to estimate, or calculate, a correction to the control signal used to control or adjust the position of the optical element 110 in question. The measured, calculated, or estimated acceleration at the relevant position(s) on measurement frame 300 may be input into correction control unit 700D from controller 700A. Correction control unit 700D may then calculate, or estimate, a correction that may be applied to the position of optical element 110 in accordance with the acceleration. Correction control unit 700D may then output a correction control signal related to this calculated or estimated correction. The output correction control signal may be provided to a second summation unit 700E, where it may be added to the control signal generated by controller 700B described above. The output from this second summation unit may then be provided as the control signal that controls the position of the optical element 110 in question. As such, feedforward can be used to improve the control of the position of the optical element 110 in question. Thus, feedforward and feedback may be combined in order to give accurate control of the position of the optical element 110 in question.

If the position of a second optical element 110, 120, 130, 140 in projection system PS is to be measured and/or controlled, then a third measurement system may be required. The third measurement system performs the same function, for example, for second optical element 140 whose position is to be measured and/or controlled as first measurement system 910 performs for first optical element 110 whose position is being measured and/or controlled. For example, in the example shown in FIG. 2, a third measurement system is used to measure the position of a second optical element 140 relative to measurement frame 300. In this case, the third measurement system takes a reading $X_{1_B}$ of the position of second optical element 140 relative to a position 360 on measurement frame 300. All of the possible measurements, calculations, determinations, and control of the position of first optical element 110 described herein can also be performed for any of optical elements 110, 120, 130, 140.

For any optical element 110, 120, 130, 140 whose position is to be determined, measured, and/or controlled, an extra measurement system equivalent to first measurement system 910 described herein may be provided. However, there may be only one measurement system (e.g., second measurement system 920 described herein) that measures at least one parameter dependent on the deformation of measurement frame 300. However, as the number of optical elements 110, 120, 130, 140 being controlled increases, the number of parameters that are measured by second measurement system 920 may desirably increase. Increasing the number of parameters measured by second measurement system 920 may improve the accuracy of the estimated deformation of measurement frame 300.

Force frame 200 may be mounted on another frame 500, as shown in FIG. 2. Additionally, measurement frame 300 may also be mounted on another frame 550. Typically, force frame 200 and measurement frame 300 may be resiliently mounted to their respective frames. Any suitable mount may be used to mount force frame 200 onto its respective frame 500 and measurement frame 300 onto its respective frame 550. For example, a vibration isolating mount may be used. Typically, an actively damped leaf spring vibration isolator could be used. Alternatively, a piezo actuator lens mount may be used. In an embodiment, an actively damped leaf spring vibration isolator may be used to mount measurement frame 300 to its respective frame 550, and a piezo actuator lens mount may be used to mount force frame 200 to its respective frame 500. In other words, a vibration isolation system or support system may be used to mount measurement frame 300 to its respective frame 550 and/or to mount force frame 200 to its respective frame 500. The vibration isolation system or support system could be damped (for example actively damped), or not damped, as required.

As will be seen from FIG. 2, position 350 on measurement frame 300 used to mount measurement frame 300 to another frame 550 may be taken as a reference point 350 relative to which the position of optical elements 110, 120, 130, 140 may be calculated, determined and/or controlled.

Frame 500 to which force frame 200 is mounted may, in some embodiments, be the same as frame 550 to which measurement frame 300 is mounted. This frame 500, 550 to which both measurement frame 300 and force frame 200 are mounted may be a frame that may then be used to locate, or mount, the projection system into a lithographic apparatus. Alternatively, frame 500, 550 to which both force frame 200 and measurement frame 300 is mounted may be part of a lithographic apparatus itself. For example, the common frame 500, 550 may be a reference frame of a lithographic apparatus. Such a reference frame may be used in conjunction with a further measurement system in the lithographic apparatus which is configured to measure the position of at least one of a patterning device and a substrate W relative to the reference frame.

Alternatively, force frame 200 may be mounted to one frame in a lithographic apparatus, and measurement frame 300 may be mounted to a different frame in a lithographic apparatus. As such, force frame 200 may be mounted to a base frame 500 of a lithographic apparatus, and measurement frame 300 may be mounted to a reference frame (as defined above) of the lithographic apparatus. In this case, a base frame may be a frame to which at least one of a support constructed to support a patterning device, a substrate table and the reference frame of the lithographic apparatus are mounted.

In some embodiments, there may be more than one force frame 200. For example, there may be two, three, four, five, or more than five frames. Each force frame may have mounted thereon one or more optical elements 110, 120, 130, 140. Each force frame may be mounted to another frame. Each force frame may be mounted to the same frame, for example, a reference frame 550 (as defined above) or a base frame 500 of a lithographic apparatus.

Additionally or alternatively, in some embodiments there may be more than one measurement frame 300. For example, there may be two, three, four, five, or more than five measurement frames. Each measurement frame may be used to measure the position of one, or more than one (for example two, three, four, five or more than five) optical element(s). A parameter relating to the deformation of each (or at least one) of the measurement frames may then be measured. This parameter may be, for example, a measurement relating to the relative position of at least two points on the same measurement frame, or any other parameter relating to the deformation of a measurement frame, as described herein. Alternatively, the parameter may be the displacement of one of the measurement frames relative to at least one of the other measurement frames. For example, the position or positions of at least one point on one measurement frame may be measured relative to at least one point on at least one other measurement frame. Each measurement frame may be mounted to another frame. For example, each measurement frame may be (for example resiliently) mounted to a reference frame 550 (as defined above) of the lithographic apparatus. Frame 550 to which each of the measurement frames may be mounted may be the same frame.

As will be appreciated, projection system PS described herein may be incorporated into any lithographic apparatus. As such, any feature of, or method performed by, projection system PS (or any part thereof) described herein may equally be incorporated into a lithographic apparatus. Whilst projection system PS may be incorporated into any lithographic apparatus, it is envisaged that projection system PS described herein may be of particular benefit when incorporated into a lithographic apparatus with a high numerical aperture, as discussed above. It is also envisaged that the projection system described herein may be particularly beneficial when incorporated into a lithographic apparatus in which the radiation used to expose a substrate W is extreme ultraviolet radiation (i.e. an EUV lithographic apparatus).

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that embodiments of the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described.

For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the clauses set out below.

What is claimed is:

1. A projection system for a lithographic apparatus comprising:
   a first frame; a second frame not coupled to the first frame; an optical element mounted to the first frame;
   a first measurement system configured to measure a position of the optical element;
   a second measurement system configured to measure at least one position on the second frame relative to at least one other position on the second frame corresponding to a deformation of the second frame; and
   a controller configured to use the measurements of the first measurement system and the second measurement system to determine a position of the optical element relative to a reference point on the second frame.

2. The projection system for a lithographic apparatus according to claim 1, wherein the controller is further configured to control the position of the optical element based on the measurements of the first measurement system and the second measurement system.

3. The projection system for a lithographic apparatus according to claim 1, wherein:
   the first measurement system comprises a first sensor configured to determine the position of the optical element relative to a first location on the second frame; and
   the controller is configured to determine the change in position of the first location on the second frame relative to the reference point resulting from the deformation of the second frame using the measurement from the second measurement system.

4. The projection system for a lithographic apparatus according to claim 1, further comprising:
   at least a second optical element mounted to the first frame; and
   a third measurement system configured to determine the position of the second optical element relative to the second frame,
   wherein the controller is further configured to use the measurements of the first measurement system and the third measurement system to determine a position of the second optical element relative to the reference point on the second frame.

5. The projection system for a lithographic apparatus according to claim 1, wherein:
   the first measurement system comprises a first sensor configured to determine the position of the optical element relative to a first location on the second frame; and
   the second measurement system comprises a second sensor configured to measure the at least one position on the second frame relative to the at least one other position on the second frame.

6. The projection system for a lithographic apparatus according to claim 1, wherein the second measurement system comprises a sensor configured to measure the strain of at least a part of the second frame.

7. The projection system for a lithographic apparatus according to claim 1, further comprising an actuator configured to provide a force between the optical element and the first frame.

8. The projection system for a lithographic apparatus according to claim 1, further comprising a third frame, wherein:
   the first frame is mounted to the third frame by at least one resilient support; and
   the second frame is mounted to the third frame by at least one resilient support.

9. The projection system for a lithographic apparatus according to claim 1, further comprising a temperature control system configured to drive the temperature of the second frame to a predetermined value.

10. The projection system for a lithographic apparatus according to claim 9, wherein the temperature control system comprises a controller configured to drive the temperature of the second frame towards the predetermined value only when the projection system is not being used for exposing a substrate.

11. The projection system for a lithographic apparatus according to claim 9, wherein the temperature control system is configured, in use, to drive the temperature of the second frame towards the predetermined value by decreasing the thermal time constant of the second frame.

12. The projection system for a lithographic apparatus according to claim 11, wherein the temperature control system is configured to decrease the thermal time constant of the second frame by increasing the heat transfer rate to and/or from the second frame.

13. The projection system for a lithographic apparatus according to claim 9, wherein the temperature control system is configured to drive the temperature of the second frame to the predetermined value by:
   supplying and/or removing heat from the second frame using a fluid flow; and
   controlling the fluid flow using a controller configured to control the temperature of the fluid flow.

14. The projection system for a lithographic apparatus according to claim 9, wherein the temperature control system is configured to drive the temperature of the second frame to the predetermined value by:
   supplying gas to the environment surrounding the second frame using a gas supply unit; and
   controlling the pressure of the gas supplied to the environment surrounding the second frame using a gas supply control unit.

15. The projection system for a lithographic apparatus according to claim 9, wherein the predetermined temperature to which the second frame is driven by the temperature control system is the temperature that is to be maintained when the projection system is used in the exposure of a substrate.

16. A lithographic apparatus, comprising:
- a support constructed to support a patterning device that is capable of imparting a radiation beam with a pattern in its cross-section to form a patterned radiation beam;
- a substrate table constructed to hold a substrate;
- a projection system having a first frame, a second frame not coupled to the first frame, an optical element mounted to the first frame, the projection system being configured to project the patterned radiation beam onto a target portion of the substrate;
- a first measurement system configured to measure a position of the optical element;
- a second measurement system configured to measure at least one position on the second frame relative to at least one other position on the second frame corresponding to a deformation of the second frame; and
- a controller configured to use the measurements of the first measurement system and the second measurement system to determine a position of the optical element relative to a reference point on the second frame.

17. The lithographic apparatus according to claim 16, further comprising a reference frame and a measurement system configured to measure the position of at least one of the patterning device and the substrate relative to the reference frame, wherein:
- the first frame is mounted to the reference frame by at least one resilient support; and
- the second frame is mounted to the reference frame by at least one resilient support.

18. The lithographic apparatus according to claim 16, further comprising:
- a reference frame and a measurement system configured to measure the position of at least one of the patterning device and the substrate relative to the reference frame; and
- a base frame to which at least one of the supports constructed to support a patterning device, the substrate table and the reference frame is mounted, wherein:
  - the first frame is mounted to the base frame by at least one resilient support; and the second frame is mounted to the reference frame by at least one resilient support.

19. A method of positioning an optical element in a projection system that comprises first and second frames, the second frame not being coupled to the first frame, the method comprising:
- measuring a position of the optical element, wherein the optical element is mounted to the first frame;
- measuring at least one position on the second frame relative to at least one other position on the second frame corresponding to a deformation of the second frame; and
- determining, based on the measured position and the measured at least one position, a position of the optical element relative to a reference point on the second frame.

20. The method of positioning an optical element in a projection system according to claim 19, further comprising: controlling a position of the optical element based on the result of the determining step.

21. The method of positioning an optical element according to claim 19, wherein the method further comprises driving the temperature of the second frame to a predetermined level.

22. A method of projecting a beam of radiation onto a substrate, comprising:
- providing a beam of radiation using a radiation source;
- providing an optical element mounted to a first frame;
- measuring a position of the optical element;
- measuring at least one position on a second frame relative to at least one other position on the second frame corresponding to a deformation of the second frame, wherein the second frame is not coupled to the first frame;
- positioning the optical element relative to a reference point on the second frame of a projection system based on the measured position and the measured at least one position; and
- directing the beam of radiation with the optical element.

23. A device manufacturing method comprising projecting a patterned beam of radiation onto a substrate using the method of claim 22.

* * * * *